(12) United States Patent
Honma et al.

(10) Patent No.: US 7,022,594 B2
(45) Date of Patent: Apr. 4, 2006

(54) MANUFACTURING METHOD WHICH PREVENTS ABNORMAL GATE OXIDATION

(75) Inventors: Toshihiro Honma, Tokyo (JP); Masahiro Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/737,821

(22) Filed: Dec. 18, 2003

(65) Prior Publication Data

US 2004/0127004 A1 Jul. 1, 2004

Related U.S. Application Data

(62) Division of application No. 09/493,147, filed on Jan. 28, 2000, now abandoned.

(30) Foreign Application Priority Data

Feb. 2, 1999 (JP) ................................ 11-025105

(51) Int. Cl.
*H01L 21/336* (2006.01)
*H01L 21/3205* (2006.01)
*H01L 21/4763* (2006.01)

(52) U.S. Cl. ..................... 438/585; 438/287; 438/591
(58) Field of Classification Search ................ 438/585, 438/257, 775, 201, 591, 287, 258, 259, 757
See application file for complete search history.

(56) References Cited

U.S. PATENT DOCUMENTS

| | | | | |
|---|---|---|---|---|
| 5,210,047 A | * | 5/1993 | Woo et al. ................... 438/257 |
| 5,278,441 A | | 1/1994 | Kang et al. |
| 5,872,385 A | * | 2/1999 | Taft et al. ................... 257/437 |
| 6,074,922 A | * | 6/2000 | Wang et al. ................. 438/303 |
| 6,075,274 A | * | 6/2000 | Wu et al. .................... 438/595 |
| 6,114,736 A | * | 9/2000 | Balasubramanyam et al. ... 257/412 |
| 6,147,388 A | | 11/2000 | Ma et al. |
| 6,208,004 B1 | * | 3/2001 | Cunningham ............... 257/413 |
| 6,236,093 B1 | | 5/2001 | Hiura |
| 6,291,868 B1 | * | 9/2001 | Weimer et al. ............. 257/413 |
| 6,369,418 B1 | * | 4/2002 | Perng et al. ................. 257/296 |
| 6,373,114 B1 | * | 4/2002 | Jeng et al. ................... 257/413 |
| 6,706,594 B1 | * | 3/2004 | Hurley ....................... 438/258 |
| 6,734,055 B1 | * | 5/2004 | Lin et al. .................... 438/201 |
| 6,770,571 B1 | * | 8/2004 | Jeng et al. ................... 438/775 |
| 6,774,437 B1 | * | 8/2004 | Bryant et al. ............... 257/350 |

FOREIGN PATENT DOCUMENTS

| | | |
|---|---|---|
| JP | 62-86865 | 4/1987 |
| JP | 08321613 | 12/1996 |
| JP | 10135460 | 5/1998 |

* cited by examiner

*Primary Examiner*—Walter L. Lindsay, Jr.
(74) *Attorney, Agent, or Firm*—Volentine Francos & Whitt, PLLC

(57) ABSTRACT

A method for manufacturing a gate electrode structure for preventing abnormal oxidation of a refractory metal due to an oxidation process, includes forming an insulating film on a surface of a semiconductor substrate; forming an impurity diffused polysilicon film on the insulating film; forming an impurity diffusion preventing film on the impurity diffused polysilicon film; forming a silicon-based film on the impurity diffusion preventing film; forming a refractory metal on the silicon-based film; forming a nitride film on the refractory metal silicide film; patterning the impurity diffused polysilicon film, the impurity diffusion preventing film, the silicon-based film, the refractory metal silicide film and the nitride film on a gate electrode; and performing an oxidation process.

8 Claims, 6 Drawing Sheets

MANUFACTURING METHOD WHICH PREVENTS ABNORMAL GATE OXIDATION

CROSS REFERENCE TO RELATED APPLICATIONS

This is a divisional application of application Ser. No. 09/493,147, filed Jan. 28, 2000 now abandoned, which is hereby incorporated by reference in its entirety for all purposes.

BACKGROUND OF THE INVENTION

1. Field of the Invention

The present invention relates to a polycide gate electrode in a semiconductor device, and more particularly to a gate electrode structure for a MOS (Metal Oxide Semiconductor) type transistor having a dial gate structure for use in N-type and P-type polycide gate electrodes, and a manufacturing method thereof.

2. Description of the Prior Art

Description will be given as to a conventional method for manufacturing a semiconductor device having a dual gate structure in which N-type and P-type polycide gates are used for a gate electrode. Here, a polycide gate electrode for an N-type MOS transistor will be explained with reference to FIG. 7. Further, a TEG (Test Element Group) for a transistor device is exemplified for the brief explanation.

A P-type well 12 is formed on a silicon substrate 10 as a semiconductor substrate, and a field oxide film 14a for separating an device is formed. A gate oxide film 14b having a thickness of 10 nm is formed on a transistor forming portion. A polysilicon film is then formed on the entire surface so as to have a thickness of 10 nm by the LP-CVD (Low Pressure—Chemical Vapor Deposition) method. The polysilicon film in a P-type MOS transistor forming region is masked with a resist in a photolithography process, and implantation of the N-type impurity ion (phosphorus, arsenic and others) is carried out. The impurity diffusion is performed by the heat treatment after removing the resist so that a polysilicon film 16 (which will be simply referred to as an impurity diffused polysilicon film hereinafter) in which the N-type impurity is diffused is formed. Subsequently, a titanium silicide film ($TiSi_2$) 18 having a thickness of 5 nm is formed on the polysilicon film having the impurity diffused polysilicon film as an impurity diffusion preventing film. A tungsten silicide film (WSix) 20 is thereafter formed on the titanium silicide film as a refractory metal silicide film so as to have a thickness of 100 nm. Further, a nitride film 22 having a thickness of 100 nm is formed on the tungsten film for insulation. This state is shown in FIG. 7(a).

Thereafter, a gate electrode pattern is formed by the photolithography and etching processes. The P-type MOS transistor forming region is masked with the resist in the photolithography process, and impurity ion implantation is carried out in order to form an N-diffusion layer 24 having an LDD (lightly Doped Drain) structure. This state is shown in FIG. 7(b).

After removing the resist, the oxidation process is effected with respect to the silicon substrate including the gate electrode pattern so that the oxide film 50 is formed on the side surface of the gate electrode. Then, in accordance with the LP-CVD method, the nitride film having a thickness of 300 to 400 nm is formed on the gate electrode which is exposed together with the oxide film on the gate electrode side surface. The nitride film is subjected to the anisotropic etching to form a second spacer 28 on the side surface of the gate electrode. Further, the gate electrode and the exposed gate oxide film in the P-type MOS transistor forming region are masked with the resist by the photolithography process, and the impurity ion plantation for forming the $N^+$ diffusion layer 30 for the source and the drain is carried out. This state is shown in FIG. 7(c).

An insulating film 52 such as the oxide film having a thickness of 400 to 800 nm is formed on the gate electrode, the exposed gate electrode oxide film and the field oxide film for insulation by the CVD method, and the surface of this insulating film 52 is smoothed. Thereafter, an opening portion 33 for a contact is formed by the photolithography and etching processes. This state is shown in FIG. 7(d). A metal 55 such as tungsten is embedded in the contact opening portion 33. A metal film such as aluminum is formed on the insulating film 52 including the metal 55 so as to have a thickness of 500 to 800 nm. A wiring 54 is formed by the photolithography and etching processes. This state is shown in FIG. 7(e).

FIG. 8(a) is a schematic plan view showing a TEG pattern after forming the contact opening portion. FIG. 8(b) is a view showing the cross-sectional shape taken along the 8(b)—8(b) line in FIG. 8A. The cross-sectional shape shown in FIG. 7(d) corresponds to the line 7(d)—7(d) in FIG. 8(a). Since the dual gate structure is provided, the N-type well 13 is formed on the side of the PMOS transistor as shown in FIGS. 8(a) and 8(b) which are schematic plan view and a cross sectional view, respectively. Further, the following process is carried out with respect to the gate electrode polysilicon on the PMOS transistor side as similar to the method for forming the impurity diffusion polysilicon on the N-type MOS transistor side. The polysilicon in the N-type MOS transistor forming region is masked with the resist in the photolithography process and the P-type impurity ion (which is mainly boron) is imoplanted in the polysilicon film on the PMOS transistor side. The P-type impurity is diffused by the heat treatment after removing the resist so that the P-type impurity diffused polysilicon film 17 is formed. Therefore, as shown in the cross-sectional view of FIG. 8(b), the N-type impurity diffused region and the P-type impuriyt diffused region exist in the polysilicon film formed in one step.

In the above-mentioned method for manufacturing the gate electrode for the MOS transistor, however, there are the following problems. The N-type diffused region and the P-type diffused region exist in the polysilicon film formed in one step. The impurity diffusion preventing film is formed for preventing the mutual diffusion of the N-type impurity and the P-type impurity. In the oxidizing process for forming the oxide film in the diffusion layer forming region for the source and the drain, since the impurity diffusion preventing film is provided in the lower layer of tungsten, the silicon is not supplied from the impurity doped polysilicon. There occurs abnormal oxidization such as that a refractory metal oxide film ($W_2O_3$) which is an oxide of tungsten is formed. This abnormal oxide portion results in a pattern failure.

SUMMARY OF THE INVENTION

It is therefore an object of the present invention to provide a gate electrode structure for a MOS-type transistor for preventing abnormal oxidization of tungsten in a tungsten polycide gate electrode, and a manufacturing method thereof.

The gate electrode structure for the MOS-type transistor according to the present invention is constituted by: a gate electrode in which an impurity diffused polysilicon film, an impurity diffusion preventing film, a silicon-based film, a refractory metal silicide film and a nitride film are superimposed in the mentioned order; and an oxide film for covering the side surfaces of the impurity diffused polysilicon film, the impurity diffusion preventing film, the silicone-based film and the refractory metal silicide film.

The silicon-based film may be a polysilicon film or an amorphous silicon film.

On the other hand, the gate electrode structure according to the present invention can be obtained by the following manufacturing method comprising: a step for forming an insulating film on a semiconductor substrate surface; a step for forming an impurity diffused polysilicon film on the insulating film; a step for forming an impurity diffusion preventing film on the impurity diffused polysilicon film; a step for forming a silicon-based film on the impurity diffusion preventing film; a step for forming a refractory metal silicide film on the silicon-based film; a step for forming a nitride film on the refractory metal silicide film; a step for patterning the impurity diffused polysilicon film, the impurity diffusion preventing film, the silicon-based film; the high-melting point metal silicide film and the nitride film on the gate electrode; and a step for performing an oxidation process.

DETAILED DESCRIPTION OF THE PREFERRED EMBODIMENTS

A preferred embodiment according to the present invention will now be described in detail hereinafter. For example, a silicon substrate is used as a semiconductor substrate. Additionally, in the embodiment according to the present invention, description will be given as to an N-type MOS transistor side. If the conductor type of the P-type MOS transistor is reversed, its structure and manufacturing method become similar to those of the N-type MOS transistor, and hence their explanation will be omitted. Further, description as to the device separation region of the field oxide film shown in FIG. 7 will be also omitted.

The manufacturing method of the gate electrode in the first embodiment according to the present invention will be explained hereunder with reference to FIG. 1.

Figure 1A:
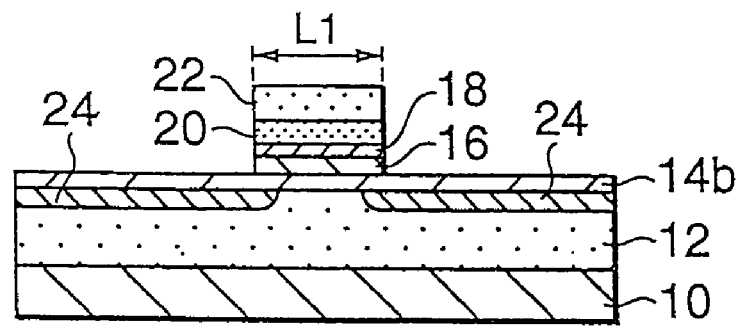
FIGS. 1 (a)–1(d) are flow diagrams of cross-sectional forms showing a gate electrode manufacturing method according to a first embodiment of the present invention.

As similar to the prior art, a P-type well 12 is formed on a silicon substrate 10 as a semiconductor substrate. A gate oxide film 14b having a thickness of 10 nm is formed as an insulating film on a transistor forming portion on the surface of the P-type well 12 which is the semiconductor substrate. A polysilicon film having a thickness of 100 nm is formed on the gate oxide film 14b by the LP-CVD method. The N-type impurity ion implantation is performed with respect to the polysilicon film. The N-type impurity diffusion is carried out to the polysilicon film by the heat treatment, and an impurity diffused polysilicon film 16 is formed. A titanium silicide film 18 as an impurity diffusion preventing film is then formed on the impurity diffused polysilicon film 16 so as to have a thickness of 5 nm. Thereafter, a tungsten silicide film 20 having a thickness of 100 nm as refractory metal silicide is formed on the titanium silicide film 18. Moreover, a nitride film having a thickness of 100 nm is formed on the tungsten silicide film 20 for insulation. The gate electrode is patterned by the photolithography and etching processes. Further, the impurity ion implantation is carried out with respect to the surface of the P-type well 12 through the exposed gate oxide film in order to form an N⁻diffusion layer 24 having the LDD structure. This state is shown in FIG. 1(a).

Figure 1B:
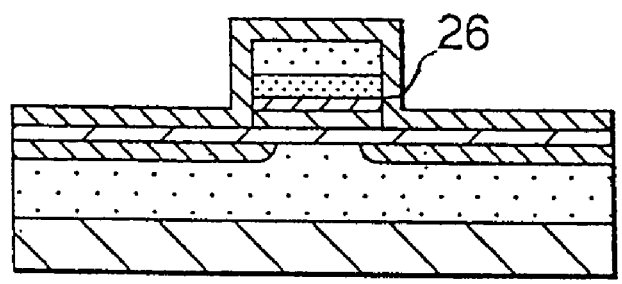
Figure 1C:
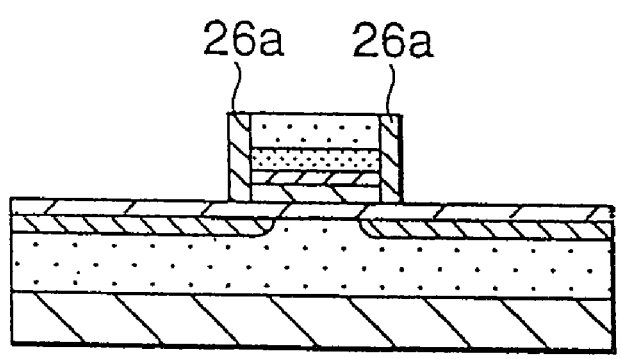
Figure 1D:
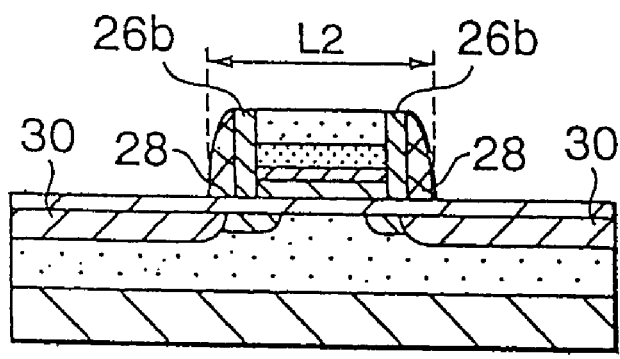

Subsequently, a polysilicon film 26 having a thickness of 10 to 20 nm is formed as a silicon-based film on at least the top surface and the side surfaces of the gate electrode (FIG. 1(b)). Anisotropic etching is performed to the polysilicon film 26, and a first spacer 26a consisting of the polysilicon film is formed on the side surfaces of the gate electrode. This state is shown in FIG. 1(c). The first spacer of the polysilicon film becomes an oxide film 26b by the subsequent oxidation process. A nitride film having a thickness of 300 to 400 nm is then formed by the LP-CVD method so as to cover the gate electrode including the oxide film 26b. The anisotropic etching is carried out with respect to the nitride film so that a second spacer 28 consisting of the nitride film is formed on the side surfaces of the gate electrode through the oxide film 26b. The impurity ion implantation is effected with respect to the surface of the P-type well 12 through the exposed gate oxide film in order to form an N⁺diffusion layer 30 for the source and the drain. This state is shown in FIG. 1(d). Thereafter, a transistor TEG is formed as similar to the prior art.

According to the manufacturing method of the first embodiment, since the first spacer 26a of the polysilicon film is formed on the entire side surfaces of the gate electrode to thereafter perform the oxidation process, the silicon of the first spacer 26a is consumed to form the oxide film 26b. Therefore, the refractory metal oxide film is hardly formed as compared with the prior art. Further, in this case, since the oxide film 26b is also formed on the side surfaces of the nitride film 22, the side wall of the gate electrode has no step portion formed thereon and is substantially uniformly formed, which is preferable. Here, although the first spacer 26a is formed by the polysilicon film as the silicon-based film, an amorphous silicon film may be likewise used.

The method for manufacturing the gate electrode in a second embodiment according to the present invention will now be described hereinafter with reference to FIG. 2.

Figure 2A:
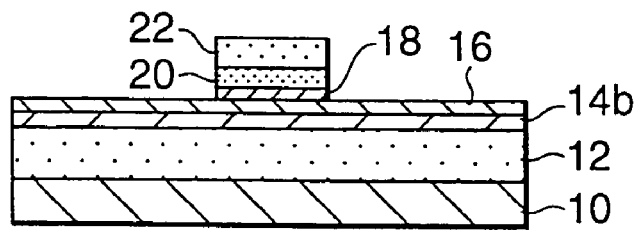
FIGS. 2(a)–2(d) are flow diagrams of cross-sectional forms showing a gate electrode manufacturing method according to a second embodiment of the present invention.
Figure 2B:
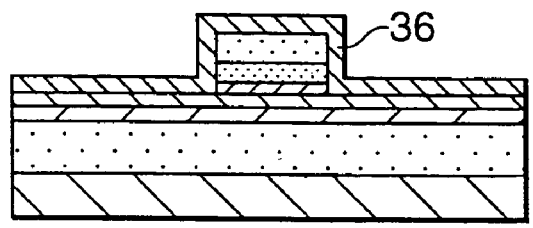

As similar to the prior art, a P-type well 12 is formed on a silicon substrate 10 as a semiconductor substrate. A gate oxide film 14b having a thickness of 10 nm is formed as an insulating film on a transistor forming portion on the surface of the P-type well 12 which is the semiconductor substrate. A polysilicon film is then formed on the gate oxide film 14b by the LP-CVD method so as to have a thickness of 10 nm. N-type impurity ion implantation is carried out with respect to the polysilicon film. The N-type impurity is diffused in the polysilicon film by the heat treatment so that an impurity diffused polysilicon film 16 is formed. A titanium silicide film 18 as an impurity diffusion preventing film is then formed on the impurity diffused polysilicon film 16 so as to have a thickness of 5 nm. Thereafter, a tungsten silicide film 20 as refractory metal silicide is formed on the titanium silicide film 18 so as to have a thickness of 10 nm. A nitride film 22 having a thickness of 100 nm is formed on the tungsten silicide film 20 for insulation. A resist film applied onto the nitride film 22 is formed to the pattern of the gate electrode by the photolithography process. Etching is effected from the upper-most nitride film 22 to the titanium silicide film 18, and the resist film is then removed to form a gate electrode pattern. This is determined as a first gate electrode. This state is shown in FIG. 2(a).

Subsequently, a nitride film 36 is formed on at least the top surface and the side surfaces of the first gate electrode by the LP-CVD method so as to have a thickness of 10 to 20 nm. (FIG. 2(b).

Figure 2C:
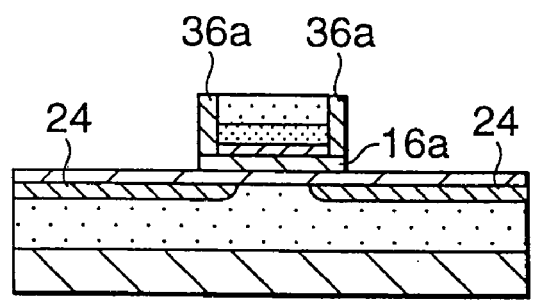

Thereafter, anisotropic etching is carried out with respect to this nitride film 36 in such a manner that the nitride film remains on the side surfaces of the first gate. The nitride film remaining on the side surface of the first gate electrode by the anisotropic etching is determined as a first spacer 36a. The impurity diffused polysilicon film 16 is then subjected to the anisotropic etching with the nitride film 22 and the first spacer 36a as a mask. The impurity diffused polysilicon 16a patterned by the anisotropic etching and the first gate electrode pattern having the first spacer 36a provided on the side surfaces thereof form an electrode. The electrode constituted by the impurity diffused polysilicon 16a, the first spacer 36a and the first gate electrode is determined as a second gate electrode. Further, impurity ion implantation is carried out to the surface of the P-type well 12 through the exposed gate oxide film in order to form an N⁻ diffusion layer 24 havin an LLD structure. This state is shown in FIG. 2(c).

Figure 2D:
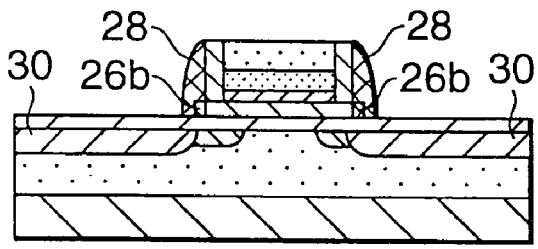

The subsequent oxidation process forms an oxide film 26b on the side surfaces of the impurity diffused polysilicon 16. Thereafter, a nitride film having a thickness of 300 to 400 nm is formed on the exposed gate oxide film including the second gate electrode and the oxide film 26b by the LP-CVD method. The anisotropic etching is then performed with respect to the nitride film in such a manner that the nitride film remains on the side surfaces of the second gate electrode. The nitride film remaining on the side surface of the second gate electrode by the anisotropic etching is determined as a second spacer 28. Thereafter, the impurity ion implantation is carried out to the surface of the P-type well through the exposed gate oxide film in order to form an N⁺diffusion layer 30 for the source and the drain. This state is shown in FIG. 2(d). Thereafter, the operation similar to those in the prior art explained above is carried out to form a transistor TEG.

According to the manufacturing method of the second embodiment, since the nitride film which is the first spacer 36a covers the side surface portion of the refractory metal silicide film 20, the refractory metal oxide film is rarely formed when performing the oxidation process for forming the oxide film 26b.

Figure 3:
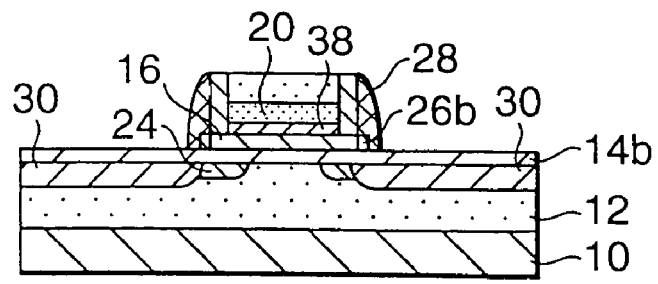
FIG. 3 is a cross-sectional form view of a gate electrode structure according to a third embodiment of the present invention.

A method for manufacturing a gate electrode in a third embodiment according to the present invention will now be described hereunder with reference to FIG. 3.

As similar to the second embodiment, a P-type well 12 is formed on a silicon substrate 10 as a semiconductor substrate. A gate oxide film 14b having a thickness of 10 nm is formed as an insulating film on a transistor forming portion on the surface of the P-type well 12 which is the semiconductor substrate. A polysilicon film having a thickness of 100 nm is then formed on the gate oxide film 14b by the LP-CVD method. N-type impurity ion implantation is carried out with respect to the polysilicon film. The N-type impurity is diffused in the polysilicon film by the heat treatment so that an impurity diffused polysilicon film 16 is formed. As different from the second embodiment, a nitride film 38 is formed as an impurity diffusion preventing film on the impurity diffused polysilicon film so as to have a thickness of 5 nm by the LP-CVD method. A tungsten silicide film 20 is then formed as a refractory metal silicide film on the nitride film 38 so as to have a thickness of 100 nm. The subsequent steps are carried out as similar to the second embodiment to form a gate electrode (FIG. 3). Further, a transistor TEG is formed.

According to the manufacturing method of the third embodiment, the base film is covered with the nitride film 38 and the top layer and the side surface are also covered with the nitride film in the tungsten silicide 20 which is a refractory metal silicide film. Therefore, a refractory metal oxide film is hardly formed in the oxidation process for forming the oxide film 26b.

As a method for forming the nitride film 38 as the impurity diffusion preventing film, there are following two methods besides the above LP-CVD method. One is a method for forming the nitride film on the surface of the base polysilicon film by carrying out RTP (Rapid Thermal Process) in NH₃ gas atmosphere at a temperature of 800 to 900° C. The other one is a method for forming the base polysilicon film by the LP-CVD method and thereafter forming the nitride film on the surface of the polysilicon film by performing the NH₃ gas atmosphere process at a temperature of 800 to 900° C. in a furnace in which the polysilicon has been formed. In the first method, since the process for each silicon substrate is allowed, a film thickness can be changed in accordance with each substrate. Further, when a number of substrates to be processed is small in the first method, the total processing time is shorter than that of the ordinary batch processing. In the second method, since the polysilicon formation and the nitride film formation are continuously carried out in the same apparatus, there occurs no problem of the organic pollution in a clean room.

Figure 4A:
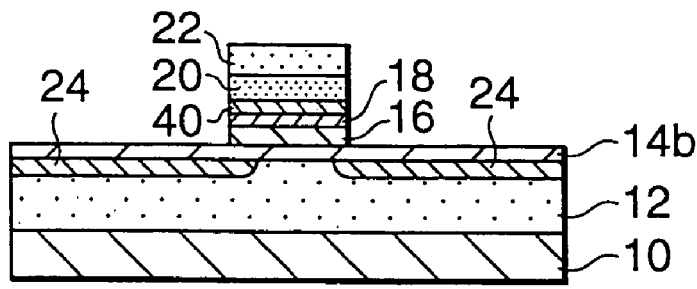
FIGS. 4(a) and 4(b) are flow diagrams of cross-sectional forms showing a gate electrode manufacturing method according to a fourth embodiment of the present invention.
Figure 4B:
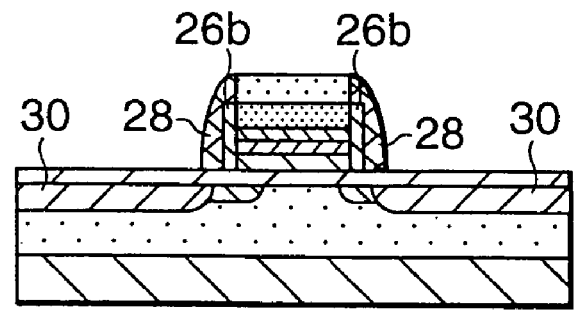

A method for manufacturing a gate electrode in a fourth embodiment according to the present invention will now be described hereunder with reference to FIG. 4.

As similar to the prior art, a P-type well 12 is formed on a silicon substrate 10 as a semiconductor substrate. A gate oxide film 14b having a thickness of 10 nm is formed as an insulating film on a transistor forming portion on the surface of the P-type well 12 which is the semiconductor substrate. A polysilicon film having a thickness of 100 nm is then formed on the gate oxide film 14b by the LP-CVD method. N-type impurity ion implantation is carried out with respect to this polysilicon film. The N-type impurity is diffused in the polysilicon film by the heat treatment so that an impurity diffused polysilicon film 16 is formed. A titanium silicide film 18 is formed on this impurity diffused polysilicon film 16 as an impurity diffusion preventing film so as to have a thickness of 5 nm. Subsequently, a polysilicon film 40 as a silicon-based film is formed on the titanium silicide film 18 so as to have a thickness of 5 to 20 nm by the LP-CVD method. Thereafter, a tungsten silicide film 20 having a thickness of 100 nm is formed on this polysilicon film 40 as a refractory metal silicide. A nitride film 22 having a thickness of 100 nm is formed on the tungsten silicide film. 20 for insulation. A gate electrode is patterned by the photolithography and etching processes. Further, impurity ion implantation is carried out with respect to the surface of the P-type well 12 through the exposed gate oxide film in order to form an N⁻diffusion layer 24 having an LDD structure. This state is shown in FIG. 4(*a*)

The oxidation process is then performed so that an oxide film 26*b* is formed on the side surface of the gate electrode. Thereafter, a nitride film having a thickness of 300 to 400 nm is formed on the exposed gate oxide film including the oxide film 26*b* and the gate electrode by the LP-CVD method. Anisotropic etching is then effected to this nitride film in such a manner that the nitride film remains on the side surfaces of the gate electrode including the oxide film 26. The nitride film remaining on the side surface of the gate electrode by this anisotropic etching is determined as a second spacer 28. Impurity ion implantation is carried out with respect to the surface of the P-type well 12 through the exposed gate oxide film in order to form an N⁺ diffusion layer 30 for the source and the drain. This state is shown in FIG. 4(*b*). The subsequent processes are performed as similar to those in the prior art described above so that a transistor TEG is formed.

According to the manufacturing method of this fourth embodiment, since the base film for the tungsten silicide film 20 which is the refractory metal silicide film is the polysilicon film 40, the refractory metal oxide film is not formed but the oxide film is formed by the silicon supplied from the polysilicon film 40 in the oxidative process for forming the oxide film 26*b*.

In addition, the polysilicon film 40 which is the base film for the tungsten silicide film 20 which is the refractory metal silicide film may be an amorphous silicon film obtained by the LP-CVD method. Also, after forming the impurity diffusion preventing film 18 on the impurity diffused polysilicon film 16 in a sputtering apparatus, an amorphous silicon film can be formed on the impurity diffusion preventing film 18 in the continuous process in this sputtering apparatus by the sputtering method.

In one of the two amorphous silicon film forming methods, i.e., the method using the LP-CVD, the process is enabled at a temperature lower than a temperature for forming the polysilicon film, e.g., 500° C. Further, in the sputtering method, since formation of the impurity diffusion preventing film 18 and formation of the amorphous silicon film are effected in the same apparatus in the continuous process, a problem such as the organic pollution in a clean room can not occur. Furthermore, in case of conveying in the atmosphere once after forming the impurity diffusion preventing film 18, a natural oxide film and the like on the surface of the impurity diffusion preventing film 18 can be removed by the etching using argon gas before forming the amorphous silicon film in the sputtering apparatus.

Figure 5A:
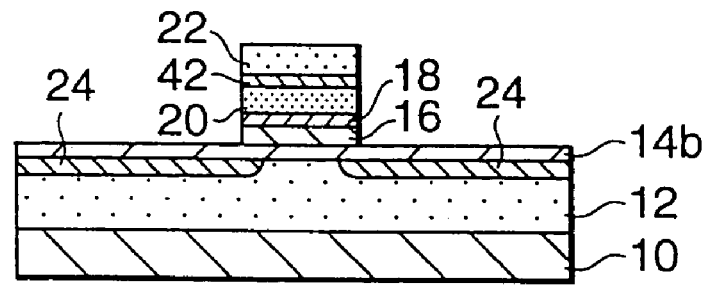
FIGS. 5(a) and 5(b) are flow diagrams of cross-sectional forms showing a gate electrode manufacturing method according to a fifth embodiment of the present invention.
Figure 5B:
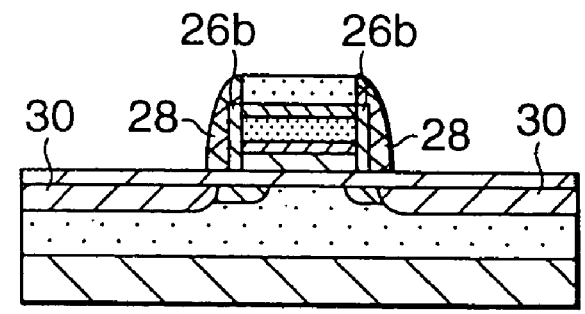
Figure 6A:
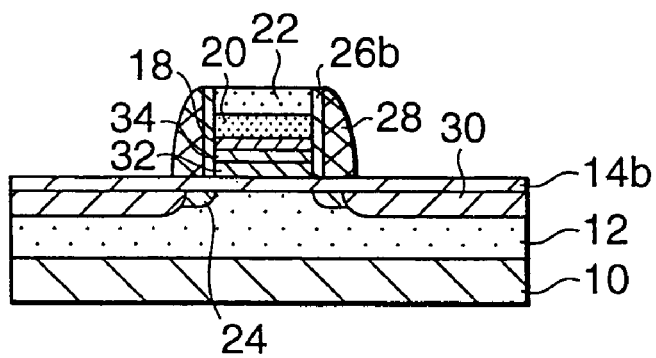
FIGS. 6(a)–6(e) are cross-sectional form views of a gate electrode according to another manufacturing method in the first to fifth embodiments of the present invention.
Figure 6B:
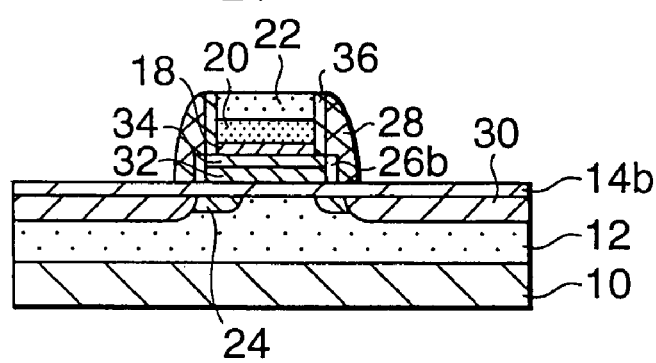
Figure 6C:
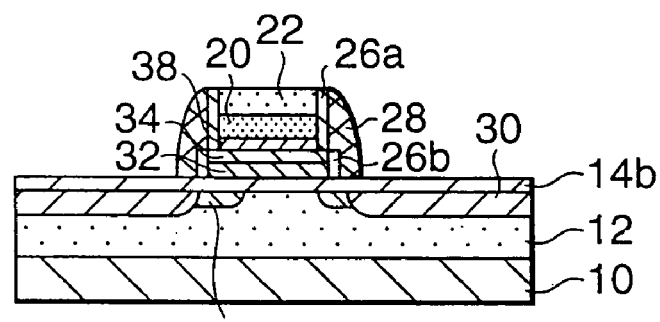
Figure 6D:
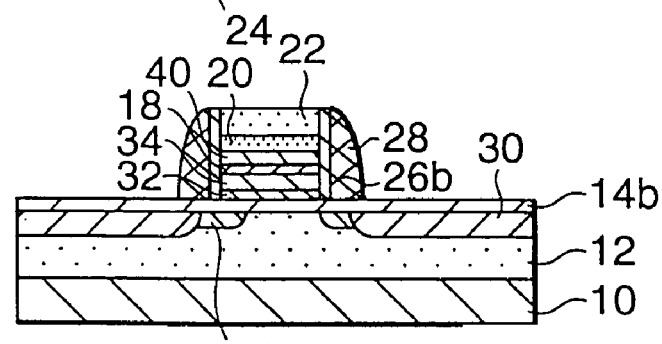
Figure 6E:
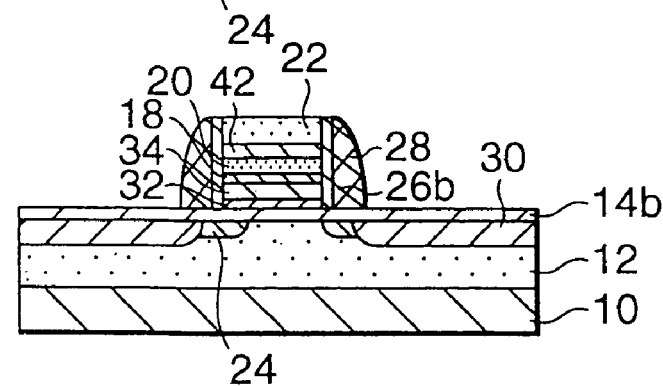
Figure 7A:
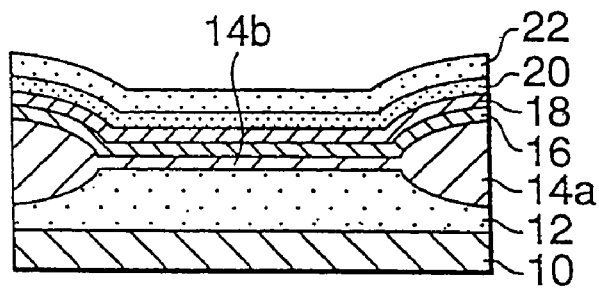
FIGS. 7(a)–7(e) are flow diagrams of cross-sectional forms showing a gate electrode manufacturing method according to a prior art.
Figure 7B:
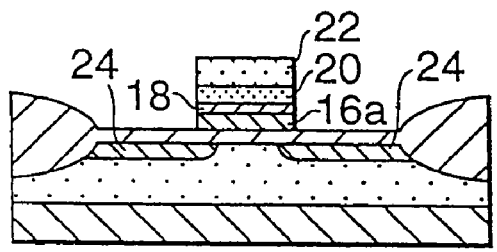
Figure 7C:
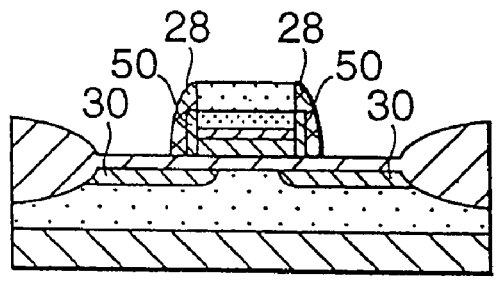
Figure 7D:
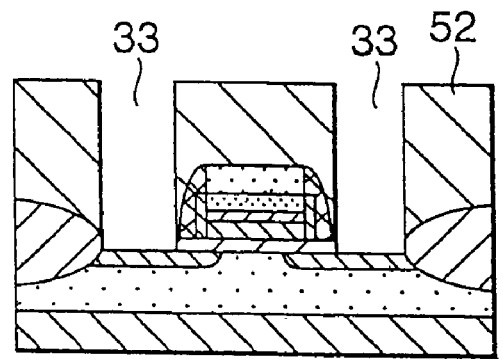
Figure 7E:
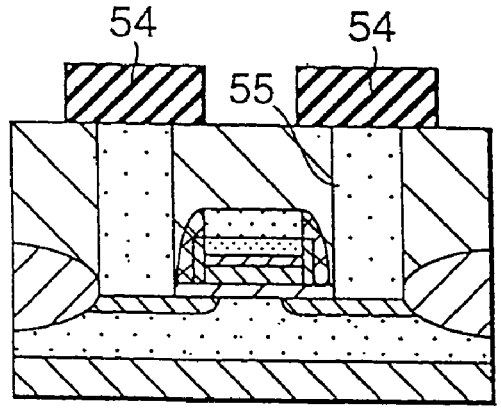
Figure 8A:
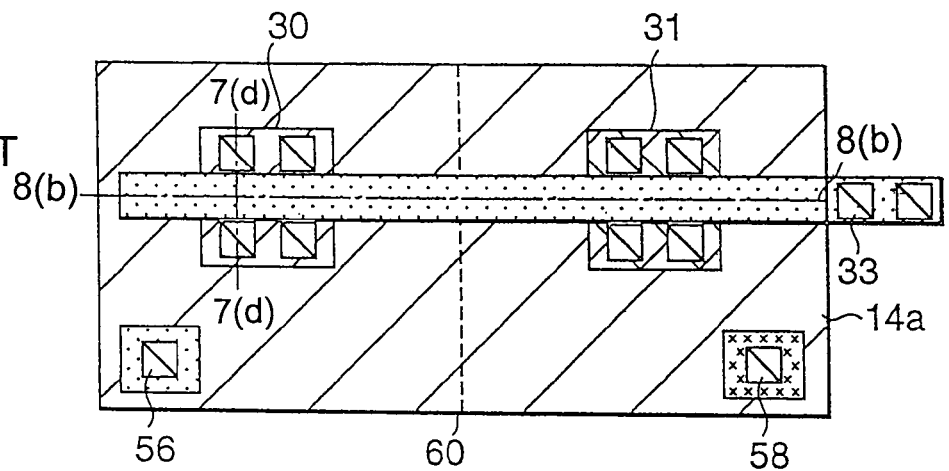
FIGS. 8(a) and 8(b) are a plan pattern view and a cross-sectional form view of TEGs of N-type MOS and P-type MOS transistors manufactured according to the prior art.
Figure 8B:
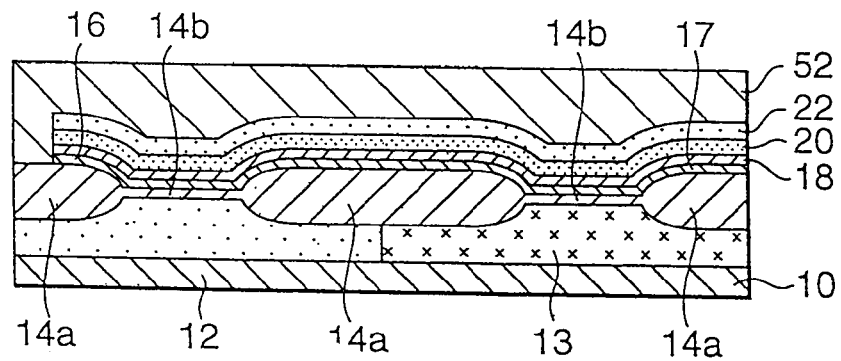

A method for manufacturing a gate electrode in a fifth embodiment according to the present invention will now be described hereunder with reference to FIG. 5.

As similar to the prior art, a P-type well 12 is formed on a silicon substrate 10 as a semiconductor substrate. A gate oxide film 14*b* having a thickness of 10 nm is formed as an insulating film on a transistor forming portion on the surface of the P-type well 12 which is the semiconductor substrate.

A polysilicon film having a thickness of 100 nm is formed on the gate oxide film 14*b* by the LP-CVD method. N-type impurity ion implantation is carried out with respect to the polysilicon film. The N-type impurity is diffused in the polysilicon film by the heat treatment so that an impurity diffused polysilicon film 16 is formed. A titanium silicide film 18 having a thickness of 5 nm is then formed as an impurity diffusion preventing film on the impurity diffused polysilicon film 16. Thereafter, a tungsten silicide film 20 is formed as a refractory metal silicide on the titanium silicide film 18 so as to have a thickness of 100 nm. Subsequently, a polysilicon film 42 as a silicon-based film is formed on the tungsten silicide film 20 so as to have a thickness of 5 to 20 nm by the LP-CVD method. Further, a nitride film 22 having a thickness of 100 nm is formed on this polysilicon film 42 for insulation. A gate electrode is patterned by the photolithography and etching processes. In addition, impurity ion implantation is performed with respect to the surface of the P-type well 12 through the exposed gate oxide film in order to form an N⁻diffusion layer 24 having an LDD structure. This state is shown in FIG. 5(*a*).

The oxidation process is then carried out to form an oxide film 26*b* on the side surfaces of the gate electrode. Thereafter, a nitride film having a thickness of 300 to 400 nm is formed on the exposed gate oxide film including the oxide film 26*b* and the gate electrode by the LP-CVD method. Anisotropic etching is performed to the nitride film in such a manner that the nitride film remains on the side surfaces of the gate electrode including the oxide film 26. The nitride film remaining on the side surfaces of the gate electrode by the anisotropic etching is determined as a second spacer 28. Further, the impurity ion plantation is effected with respect to the surface of the P-type well 12 through the exposed gate oxide film in order to form an N⁺diffusion layer 30 for the source and the drain. This state is shown in FIG. 5(*b*). The subsequent processes are carried out as similar to those in the prior art described above so that a transistor TEG is formed.

According to the manufacturing method of the fifth embodiment, since the upper layer film of the tungsten silicide film 20 which is the refractory metal silicide film is the polysilicon film 42, the refractory metal oxide film is not formed in the oxidation process for forming the oxide film 26*b* but the oxide film is formed with the silicon supplied from the polysilicon film 42.

Further, the polysilicon film 42 which is the upper layer film of the tungsten silicide film 20 which is the refractory metal silicide film may be an amorphous silicon film obtained by the LP-CVD method. Furthermore, after forming the tungsten silicide film 20 on the impurity diffusion preventing film 18 in the sputtering apparatus, the amorphous silicon film can be formed on the tungsten silicide film 20 in the sputtering apparatus by the continuous process according to the sputtering method.

In the two methods for forming the amorphous silicon film, one method using the LP-CVD can enable the process at a temperature lower than a temperature for forming the polysilicon film, e.g., 500° C. On the other hand, in the sputtering method, since formation of the tungsten silicide film 20 and formation of the amorphous silicon film are carried in the same apparatus by the continuous process, there occurs no problem of organic pollution in a clean room and the like. In addition, in case of once conveying in the atmosphere after forming the tungsten film 20, a natural oxide film and the like on the surface of the tungsten silicide film can be removed by the etching using the argon gas before forming the amorphous silicon film in the sputtering apparatus.

Moreover, since the polysilicon film 42 and the nitride film 22 can be formed in the same apparatus by the continuos process by the LP-CVD method, it is not necessary to convey them in the atmosphere, and there occurs no problem such as the organic pollution in a clean room the like.

In each of the above-described first to fifth embodiments, it is possible to apply at least one of the following methods (1) to (4).

(1) In recent years, a doped polysilicon film to which impurity diffusion is performed in the polysilicon film forming process is adopted as an impurity diffused polysilicon film in a gate electrode. Description will now be given as to application of the doped polysilicon film to the gate electrode for the N-type MOS transistor according to the present invention. As similar to the prior art, a field oxide film for a P-type well or device separation is formed on a silicon substrate as a semiconductor substrate. A gate oxide film is formed on the surface of the P-type well in a region for forming a transistor. An amorphous silicon film including phosphorus is formed on the gate oxide film at a temperature of 550° C. by the LP-CVD method using silane gas and phosphine gas. Thereafter, crystallization is performed in the nitrogen atmosphere at a temperature of 850° C. in the apparatus having formed the amorphous silicon film so that N-type impurity diffused polysilicon, namely, so-called doped polysilicon (which will be simply referred to as doped polysilicon hereinafter) is formed. The subsequent processes are based on each of the above embodiments.

When using this doped polysilicon to the gate electrode, it is further preferable to add a film forming process before forming a doped polysilicon film as follows. After forming a gate oxide film 14b, a polysilicon film 32 having a thickness of 10 to 20 nm is formed on the gate oxide film 14b as a silicon-based film. Thereafter, a doped polysilicon film 34 is formed on the polysilicon film 32. This polysilicon film 32 may be an amorphous silicon film. The subsequent processes are based on each of the embodiments. FIGS. 6(a) to (e) show the cross-sectional shapes obtained upon completion of the impurity ion implantation process for forming a source and a drain when the above process is applied to the first to fifth embodiments.

Formation of the polysilicon film 32 between the gate oxide film 14b and the doped polysilicon film 34 can obtain the following three results. A first one is suppression of segregation of phosphorus to the gate oxide film by the polysilicon film 32 in the process for crystallizing the amorphous silicon film Including phosphorus. A second result is that a mechanical stress to the gate oxide film due to the grain orientation in the crystallization process can be alleviated. A third result is that the bad resistance characteristics owing to the high-density portion can be prevented by the polysilicon film 32 when the density of the impurity in the doped polysilicon film is unevenly formed.

Further, a P-type doped polysilicon film can be formed by using gas containing boron when forming the amorphous silicon film by the LP-CVD method.

In addition, in case of applying the doped polysilicon film to an electrode of a capacitor device, the capacitor device having the excellent resistance characteristics can be formed when a silicon-based film such as the polysilicon film is formed between the insulating film and the electrode of the capacitor device.

(2) In regard to the gate electrode structure, tungsten silicide film as the refractory metal silicide film has been described, but any other refractory metal silicide film may be used.

(3) In the structure that the oxide film obtained by the LP-CVD method is formed between the refractory metal silicide film and the nitride film 22 as another gate electrode structure, a problem of formation of the refractory metal oxide by the subsequent oxidation process can occur. Therefore, the similar results can be obtained in this gate electrode structure by applying the present invention.

(4) A length of a finally obtained gate may be set as follows. For example, in the first embodiment, the fact that the oxide film 26b is approximately double the film thickness of the first spacer is taken into account in order to finish a gate length L2 shown in FIG. 1(d) to the prior art measure. That is, a gate length L1 obtained after a gate electrode etching process shown in FIG. 1(a) is so formed as to be small by the length which is double the film thickness of the first spacer as compared with the prior art. In each of the second to fifth embodiments, although depending on types of film, setting similar to that of the first embodiment can be used.

What is claimed is:

1. A method for manufacturing a gate electrode structure comprising:
   a step for forming an insulating film on a surface of a semiconductor substrate;
   a step for forming an impurity diffused polysilicon film on said insulating film;
   a step of forming an impurity diffusion preventing film on said impurity diffused polysilicon film;
   a step for forming a refractory metal silicide film on said impurity diffusion preventing film;
   a step for forming a nitride film on said refractory metal silicide film;
   a step for patterning said impurity diffused polysilicon film, said impurity diffusion preventing film, said refractory metal silicide film and said nitride film as a gate electrode;
   a step for forming a first spacer constituted by a silicon-based film on side surfaces of said gate electrode; and
   an oxidation step for forming said first spacer into an oxide film,
   wherein said silicon-based film is a polysilicon film.

2. A method for manufacturing a gate electrode structure according to claim 1, wherein said silicon-based film is formed after said step for forming said insulating film, and said step for forming said impurity diffused polysilicon film is then carried out.

3. A method for manufacturing a gate electrode structure comprising:
   a step for forming an insulating film on a surface of a semiconductor substrate;
   a step for forming an impurity diffused polysilicon film on said insulating film;
   a step of forming an impurity diffusion preventing film on said impurity diffused polysilicon film;
   a step for forming a refractory metal silicide film on said impurity diffusion preventing film;
   a step for forming a nitride film on said refractory metal silicide film;
   a step for patterning said impurity diffused polysilicon film, said impurity diffusion preventing film, said refractory metal silicide film and said nitride film as a gate electrode;

a step for forming a first spacer constituted by a silicon-based film on side surfaces of said gate electrode; and an oxidation step for forming said first spacer into an oxide film, wherein said silicon-based film is an amorphous silicon film.

4. A method for manufacturing a gate electrode structure according to claim 3, wherein said silicon-based film is formed after said step for forming said insulating film, and said step for forming said impurity diffused polysilicon film is then carried out.

5. A method for manufacturing a gate electrode structure, comprising:

forming an insulating film on a surface of a semiconductor substrate;

forming an impurity diffused polysilicon film on said insulating film;

forming an impurity diffusion preventing film on said impurity diffused polysilicon film;

forming a refractory metal silicide film on said impurity diffusion preventing film;

forming a nitride film on said refractory metal silicide film;

patterning said impurity diffused polysilicon film, said impurity diffusion preventing film, said refractory metal silicide film and said nitride film as a gate electrode;

forming a first spacer constituted by a silicon-based film on side surfaces of said gate electrode; and oxidizing said first spacer into an oxide film, wherein said silicon-based film is a polysilicon film.

6. A method for manufacturing a gate electrode structure according to claim 5, wherein said silicon-based film is formed after said forming an insulating film, and said forming an impurity diffused polysilicon film is then carried out.

7. A method for manufacturing a gate electrode structure, comprising:

forming an insulating film on a surface of a semiconductor substrate;

forming an impurity diffused polysilicon film on said insulating film;

forming an impurity diffusion preventing film on said impurity diffused polysilicon film;

forming a refractory metal suicide film on said impurity diffusion preventing film;

forming a nitride film on said refractory metal suicide film;

patterning said impurity diffused polysilicon film, said impurity diffusion preventing film, said refractory metal silicide film and said nitride film as a gate electrode;

forming a first spacer constituted by a silicon-based film on side surfaces of said gate electrode; and oxidizing said first spacer into an oxide film, wherein said silicon-based film is an amorphous silicon film.

8. A method for manufacturing a gate electrode structure according to claim 7, wherein said silicon-based film is formed after said forming an insulating film, and said forming an impurity diffused polysilicon film is then carried out.

* * * * *